(12) United States Patent
Gupta

(10) Patent No.: US 8,085,863 B2
(45) Date of Patent: Dec. 27, 2011

(54) RADIO RECEIVER OR TRANSMITTER AND METHOD FOR REDUCING AN IQ GAIN IMBALANCE

(75) Inventor: Chandra Gupta, Bochum (DE)

(73) Assignee: Nokia Corporation, Espoo (FI)

( * ) Notice: Subject to any disclaimer, the term of this patent is extended or adjusted under 35 U.S.C. 154(b) by 1203 days.

(21) Appl. No.: 11/775,622

(22) Filed: Jul. 10, 2007

(65) Prior Publication Data

US 2008/0232498 A1 Sep. 25, 2008

(30) Foreign Application Priority Data

Mar. 22, 2007 (GB) .................................. 0705544.5

(51) Int. Cl.
*H04L 5/12* (2006.01)
*H03C 3/00* (2006.01)
*G01N 27/72* (2006.01)
(52) U.S. Cl. .......................... 375/261; 375/302; 324/233
(58) Field of Classification Search .................. 375/261, 375/302, 316; 725/121; 332/103
See application file for complete search history.

(56) References Cited

U.S. PATENT DOCUMENTS

| 2002/0097812 A1* | 7/2002 | Wiss ............................. 375/316 |
| 2003/0231075 A1* | 12/2003 | Heiskala et al. .............. 332/103 |
| 2005/0013389 A1* | 1/2005 | Mizukami ..................... 375/323 |
| 2005/0157815 A1* | 7/2005 | Kim et al. ..................... 375/302 |
| 2007/0127599 A1* | 6/2007 | Song et al. .................... 375/326 |

* cited by examiner

*Primary Examiner* — David C. Payne
*Assistant Examiner* — Sarah Hassan
(74) *Attorney, Agent, or Firm* — Locke Lord LLP

(57) ABSTRACT

A radio receiver includes an in-phase channel and a quadrature channel, the channels being provided in parallel at a respective input with quadrature modulated radio frequency signals; and an error correction loop for detecting and correcting an imbalance in gain between at least part of the in-phase channel and a corresponding part of the quadrature channel, wherein the error correction loop comprises: a detector adapted to calculate $\text{Error\_det}_{new}=|I'|-|Q'|$, where $I'$ and $Q'$ are the in-phase and quadrature channels respectively; a loop filter arranged to receive $\text{Error\_det}_{new}$ from the detector and calculate $\text{loop\_filter\_out}_{new} += K_i * \text{Error\_det}_{new}$, where $K_i$ is the loop filter constant and $\text{loop\_filter\_out}_{new}$ has an initial value of 1; and a multiplier arranged to receive $\text{loop\_filter\_out}_{new}$ from the loop filter and adjust the signal of the quadrature channel by multiplying the signal by $\text{loop\_filter\_out}_{new}$.

21 Claims, 2 Drawing Sheets

RADIO RECEIVER OR TRANSMITTER AND METHOD FOR REDUCING AN IQ GAIN IMBALANCE

TECHNICAL FIELD

The technical field relates to a radio receiver for demodulating quadrature (IQ) modulated radio frequency signals, and to a corresponding radio transmitter. The technical field moreover relates to an IQ gain imbalance correction unit for such a radio receiver or transmitter, and to a base station, a mobile station and a radio communications system including such a radio receiver or transmitter. The technical field equally relates to a method for reducing an IQ gain imbalance.

BACKGROUND

Mobile stations or base stations of a radio communications system include radio receivers that receive radio frequency signals transmitted by a radio transmitter of the radio communications system. If a quadrature modulation is employed in a communications system for transmitting signals, a radio transmitter modulates the in-phase (I) and the quadrature-phase (Q) signal components by local oscillator signals that are phase offset by 90 degrees. The two modulated carrier signals are then superposed for transmission. For quadrature demodulation, the radio receiver provides two separate channels. The modulated signal is downconverted/demodulated using signals provided by a local oscillator that are again 90 degrees phase shifted to each other to produce either quadrature baseband or quadrature intermediate frequency (IF) signals. Since the original signal is processed on two separate channels for regaining the in-phase and the quadrature components, a different gain may be applied by the respective channel to the signal. In the case where the demodulation is carried out at radio frequency, most of the gain imbalance results from devices used at high frequencies that cannot match their characteristics as well as can devices used at baseband frequencies. What is needed is a way to correct the gain imbalance in an improved manner with a minimal amount of hardware.

SUMMARY

Embodiments of the invention are directed to an IQ gain imbalance correction apparatus and method for a radio receiver for demodulating quadrature (IQ) modulated radio frequency signals, and to a corresponding radio transmitter, used in a base station, a mobile station, or a radio communications system including such a radio receiver or transmitter.

In one example embodiment of the present invention, a radio receiver can include: an in-phase channel and a quadrature channel, the channels being provided in parallel at a respective input with quadrature modulated radio frequency signals; and an error correction loop for detecting and correcting an imbalance in gain between at least part of the in-phase channel and a corresponding part of the quadrature channel, wherein the error correction loop can include: a detector adapted to calculate $\text{Error\_det}_{new}=|I'|-|Q'|$, where $I'$ and $Q'$ are the in-phase and quadrature channels respectively; a loop filter arranged to receive $\text{Error\_det}_{new}$ from the detector and calculate $\text{loop\_filter\_out}_{new}+=K_i*\text{Error\_det}_{new}$, where $K_i$ is the loop filter constant and $\text{loop\_filter\_out}_{new}$ has an initial value of 1; and a multiplier arranged to receive $\text{loop\_filter\_out}_{new}$ from the loop filter and adjust the signal of the quadrature channel by multiplying the signal by $\text{loop\_filter\_out}_{new}$.

In another example embodiment of the present invention, a radio transmitter can include: an in-phase channel for in-phase components of a signal; a quadrature channel for quadrature phase components of the signal; and an error correction loop for detecting and correcting an imbalance in gain between at least part of the in-phase channel and a corresponding part of the quadrature channel, wherein the error correction loop can include: a detector adapted to calculate $\text{Error\_det}_{new}=|I'|-|Q'|$, where $I'$ and $Q'$ are the in-phase and quadrature channels respectively; a loop filter arranged to receive $\text{Error\_det}_{new}$ from the detector and calculate $\text{loop\_filter\_out}_{new}+=K_i*\text{Error\_det}_{new}$, where $K_i$ is the loop filter constant and $\text{loop\_filter\_out}_{new}$ has an initial value of 1; and a multiplier arranged to receive $\text{loop\_filter\_out}_{new}$ from the loop filter and adjust the signal of the quadrature channel by multiplying the signal by $\text{loop\_filter\_out}_{new}$.

In another example embodiment of the present invention, an error correction unit can be provided for detecting and correcting an imbalance in gain between at least part of an in-phase channel and a corresponding part of a quadrature channel, wherein the error correction unit can include: a detector adapted to calculate $\text{Error\_det}_{new}=|I'|-|Q'|$, where $I'$ and $Q'$ are the in-phase and quadrature channels respectively; a loop filter arranged to receive $\text{Error\_det}_{new}$ from the detector and calculate $\text{loop\_filter\_out}_{new}+=K_i*\text{Error\_det}_{new}$, where $K_i$ is the loop filter constant and $\text{loop\_filter\_out}_{new}$ has an initial value of 1; and a multiplier arranged to receive $\text{loop\_filter\_out}_{new}$ from the loop filter and adjust the signal of the quadrature channel by multiplying the signal by $\text{loop\_filter\_out}_{new}$.

In another example embodiment of the present invention, a method can reduce an imbalance in gain between an in-phase channel and a quadrature channel of a quadrature demodulating radio receiver, the method including: feeding quadrature modulated radio frequency signals in parallel to the in-phase channel and to the quadrature channel of the radio receiver; calculating $\text{Error\_det}_{new}=|I'|-|Q'|$, where $I'$ and $Q'$ are the in-phase and quadrature channels respectively; calculating $\text{loop\_filter\_out}_{new}+=K_i*\text{Error\_det}_{new}$, where $K_i$ is the loop filter constant and $\text{loop\_filter\_out}_{new}$ has an initial value of 1; and multiplying the signal of the quadrature channel by $\text{loop\_filter\_out}_{new}$.

In another embodiment of the present invention, a method can reduce an imbalance in gain between an in-phase channel and a quadrature channel of a quadrature modulating radio transmitter, the method including: feeding an in-phase component of a signal to the in-phase channel and a quadrature-phase component of the signal to the quadrature channel of the radio transmitter; calculating $\text{Error\_det}_{new}=|I'|-|Q'|$, where $I'$ and $Q'$ are the in-phase and quadrature channels respectively; calculating $\text{loop\_filter\_out}_{new}+=K_i*\text{Error\_det}_{new}$, where $K_i$ is the loop filter constant and $\text{loop\_filter\_out}_{new}$ has an initial value of 1; and multiplying the signal of the quadrature channel by $\text{loop\_filter\_out}_{new}$.

In another example embodiment of the present invention, a method can detect and correct an imbalance in gain between at least part of an in-phase channel and a corresponding part of a quadrature channel, the method including: calculating $\text{Error\_det}_{new}=|I'|-|Q'|$, where $I'$ and $Q'$ are the in-phase and quadrature channels respectively; calculating $\text{loop\_filter\_out}_{new}+=K_i*\text{Error\_det}_{new}$, where $K_i$ is the loop filter constant and $\text{loop\_filter\_out}_{new}$ has an initial value of 1; and multiplying the signal of the quadrature channel by $\text{loop\_filter\_out}_{new}$.

BRIEF DESCRIPTION OF THE FIGURES

Embodiments of the present invention will now be described, by way of example only, with reference to the accompanying drawings, in which.

DETAILED DESCRIPTION

Figure 1:
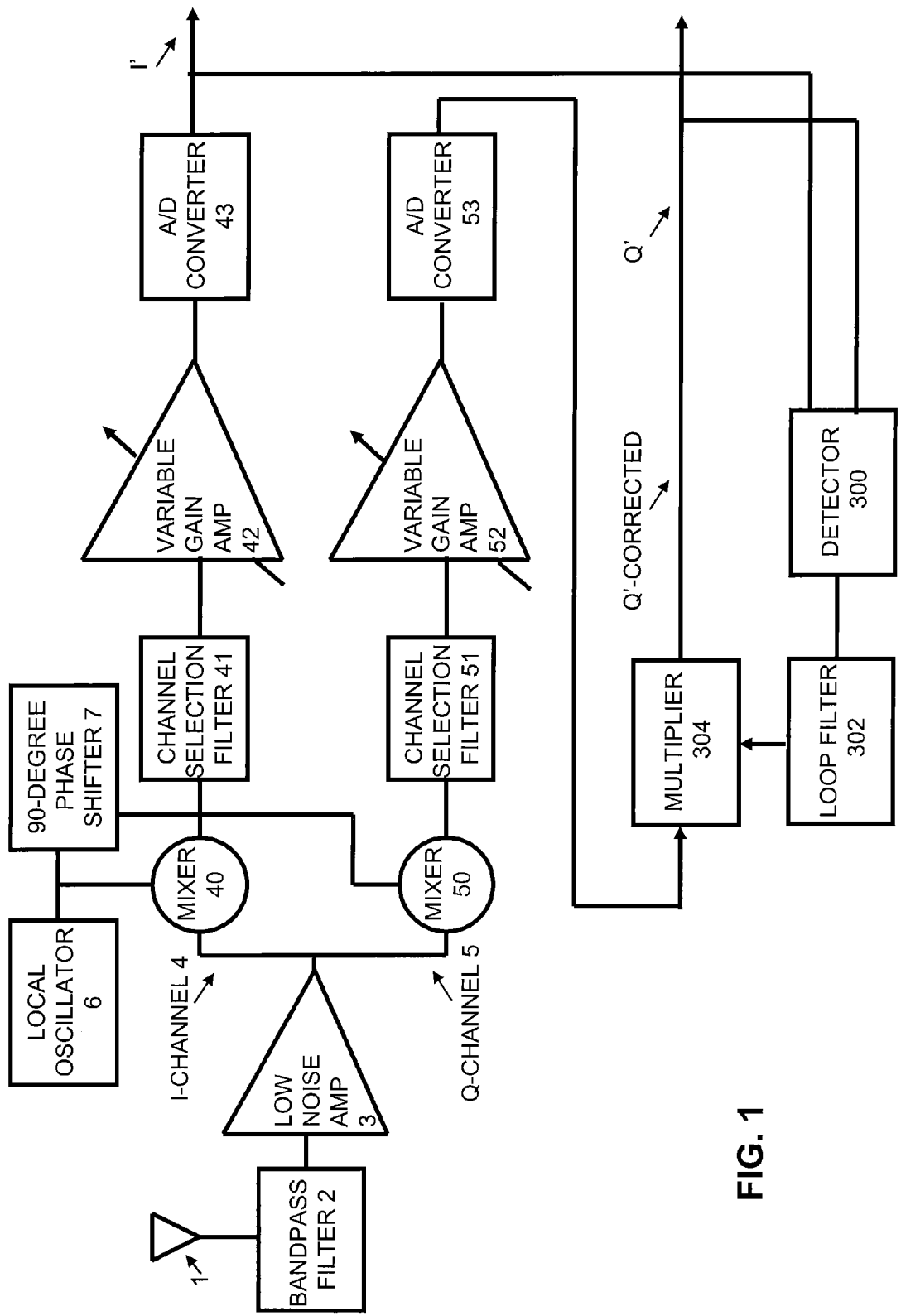
FIG. 1 is a block diagram of an IQ gain imbalance correction unit with an error correction loop in example embodiments of the present invention.

FIG. 1 is a block diagram of an IQ gain imbalance correction unit with an error correction loop in example embodiments of the present invention, to compensate for imbalances in the I and Q branches.

In the direct conversion radio receiver of FIG. 1, a receiving antenna 1 is connected via a bandpass filter 2 to a low-noise amplifier (LNA) 3. The output of the LNA 3 is connected on the one hand to an I-channel 4 of the radio receiver and on the other hand to a Q-channel 5 of the radio receiver, both channels being referred to also simply as quadrature channels. In both quadrature channels 4 and 5, a mixer 40 and 50, a channel selection filter 41 and 51, a variable gain amplifier (VGA) 42 and 52 and an analog-to-digital (A/D) converter 43 and 53 are cascaded. The outputs of both channels 4 and 5 are connected to digital signal processing units which are not shown in FIG. 1. A local oscillator 6 is further connected to the mixer 40 in the I-channel 4 and via a 90° phase shifter 7 to the mixer 50 in the Q-channel 5 of the radio receiver. Radio frequency signals are received via the receiving antenna 1. The received signals are then bandpass filtered by the bandpass filter 2 and amplified by the LNA 3 before being fed in parallel to both, I-channel 4 and Q-channel 5 of the radio receiver. In each of the two quadrature channels 4 and 5, the signals are first processed by the respective mixer 40 and 50, in order to obtain the in-phase component and the quadrature component of the received signal by mixing it with a suitable high frequency signal. In the mixer 40 of the I-channel 4, the received signal is mixed for downconversion with a high frequency signal received directly from the local oscillator 6, the output of the mixer 40 constituting the in-phase component of the received signal. In the mixer 50 of the Q-channel 5, the received signal is mixed for downconversion with the high frequency signal received from the local oscillator 6 via the 90° phase shifter 7, the output of this mixer 50 thus constituting the quadrature component of a signal. In both channels 4 and 5, the signals output by the respective mixer 40 and 50 pass the respective channel selection filter 41 and 51, by which a desired channel is selected. Subsequently, the selected channel is amplified in both channels 4 and 5 with an adjustable gain by the respective VGA 42 and 52 and converted into a digital signal by the respective analog-to-digital converter 43 and 53. The output of both analog-to-digital converters 43 and 53 is then fed to a digital signal processor for further processing in the digital domain.

Since the original signal is processed on two separate channels 4 and 5 for regaining the in-phase and the quadrature components, a different gain may be applied by the respective channel 4 and 5 to the signal. In the case where the demodulation is carried out at radio frequency, most of the gain imbalance results from the mixers 40, 50, since devices used at high frequencies cannot be implemented to match their characteristics as well as devices used at baseband frequencies. The problem of gain imbalance also occurs with integrated radio receivers, even though integrated components can be made with better tolerances that enable better matching of their characteristics.

The effects due to the mismatch in gain between the two quadrature channels can be particularly severe in a receiver that employs a non-zero intermediate frequency after quadrature downconversion, because of the high image rejection requirements (IRR) for such a receiver. However, a large gain imbalance error between the channels can also cause problems in direct conversion receiver. In a direct conversion receiver, the intermediate frequency is zero, and thus there is no image frequency. However, some image rejection is still required due to the overlap of the signal sidebands in the downconversion process. Error might occur when the typically high noise from the active channel selection filters becomes "visible" in one of the quadrature channels after a gain drop in the respective other quadrature channel.

The term "noise figure" is a number used to characterize the quality of a circuit or a channel. It represents the decrease in signal to noise ratios between the input and output, in decibels. Imbalance in the noise figures between the channels reshapes the constellation of the received signal and thus the Bit-Error-Rate (BER) deteriorates. If the required receiver noise figure is low, there is typically not much headroom for additional performance tolerances. Even a small gain mismatch between the channels can increase the noise figure of one of the quadrature channels. In a properly implemented integrated circuit, the gain error between the two quadrature channels can be about 0.5 dB without compensation.

Similar problems may occur in radio transmitters. Radio transmitters are essentially the same structure as receivers, but with the components reversed. As such, a transmitter may be provided with a similar structure to that of the receiver shown in FIG. 1, but with the signals passing from right-to-left for a transmitter, as opposed to left-to-right for a receiver.

In digital receivers, I/Q gain imbalance may be compensated for, if needed, in the digital back-end after analog signal processing. I/Q gain imbalance can also be compensated for in the analog domain prior to analog-to-digital conversion.

Balance error introduced due to unequal gain provided to the I/Q branches in the chain results in the constellation diagram shrinking or expanding in one branch as compared with the other. Mathematically this can be represented as $$s_{be}(t) = Re\{[I(t) + i < Q(t)*b >]\exp(j\omega_c t)\}$$

where I(t) is the signal in the in-phase branch, Q(t) is the signal in the quadrature-phase branch, i is the imaginary unit, $\omega_c$ is the carrier frequency. Re{x} gives the real part of x, and b is an imbalance factor in the quadrature-phase branch.

The signal can be expressed as I and Q signals in baseband:

$$I' = I(t)$$

$$Q' = Q(t)$$

Error Detection can be based on the following parameters:

$$Error\_det = |Q'| - |I'|$$

$$loop\_filter\_out \mathrel{+}= K_i * Error\_det \quad (i)$$

where $K_i$ is the loop filter constant.

Correction can be modelled as $$Q'_{corrected} = Q'_{incoming} - Q'_{incoming} * loop\_filter\_out \quad (ii)$$

The arrangement shown in FIG. 1 includes a detector 300, which detects the error, $Error\_det_{new} = |I'| - |Q'|$, a loop filter 302, which accumulates $K_i * Error\_det_{new}$ and has an initial value of 1, and a multiplier 304 which multiplies the Q branch by the output from the loop filter 302 in order to correct the Q branch.

The detector calculates the value |I'|−|Q'| rather than |Q'|−|I'|. The accumulation in the loop filter has an initial value of 1 instead of the value of zero. This leads to an efficient correction in the Q branch where a single multiplier is needed, instead of a method where a multiplier and a subtractor would be required. Thus, hardware is minimized, without any performance loss.

The error correction loop may be implemented in a radio receiver, as shown in FIG. 1. The error correction loop may be implemented after the analog-to-digital converters in the digital domain, as shown. Alternatively, the error correction loop may be implemented prior to the analog-to-digital converters in the analogue domain. In still another alternative, the error correction loop may be implemented across the analog-to-digital converters, such that the detector is provided in the digital domain and the multiplier is provided in the analogue domain.

The detection of an imbalance of gain can be carried out either by analog or digital signal processing methods. In the analog domain, the detecting means can include, in particular, a power or a Vrms (Voltage root mean square) detector, which detects the power of signals in both channels at some point after the respective down-conversion. In the digital domain, the down-converted signals are evaluated for an imbalance in gain after being converted from analog into digital signals. The evaluation can be carried out by some a conventional digital signal processor.

The radio receiver can be an integrated radio receiver and may be employed, for example, for Wideband Code Division Multiple Access (WCDMA) base station applications. It is equally possible to use discrete components.

A radio transmitter can be realized equivalently to the radio receiver of FIG. 1, but many variations are possible, as long as the gain can be adjusted according to a detected imbalance in gain or amplitude, as described herein.

A radio communications system with the radio receiver and/or transmitter embodiments of the invention can be used in a mobile station for a radio communications system and a base station of a radio communications system.

Figure 2:
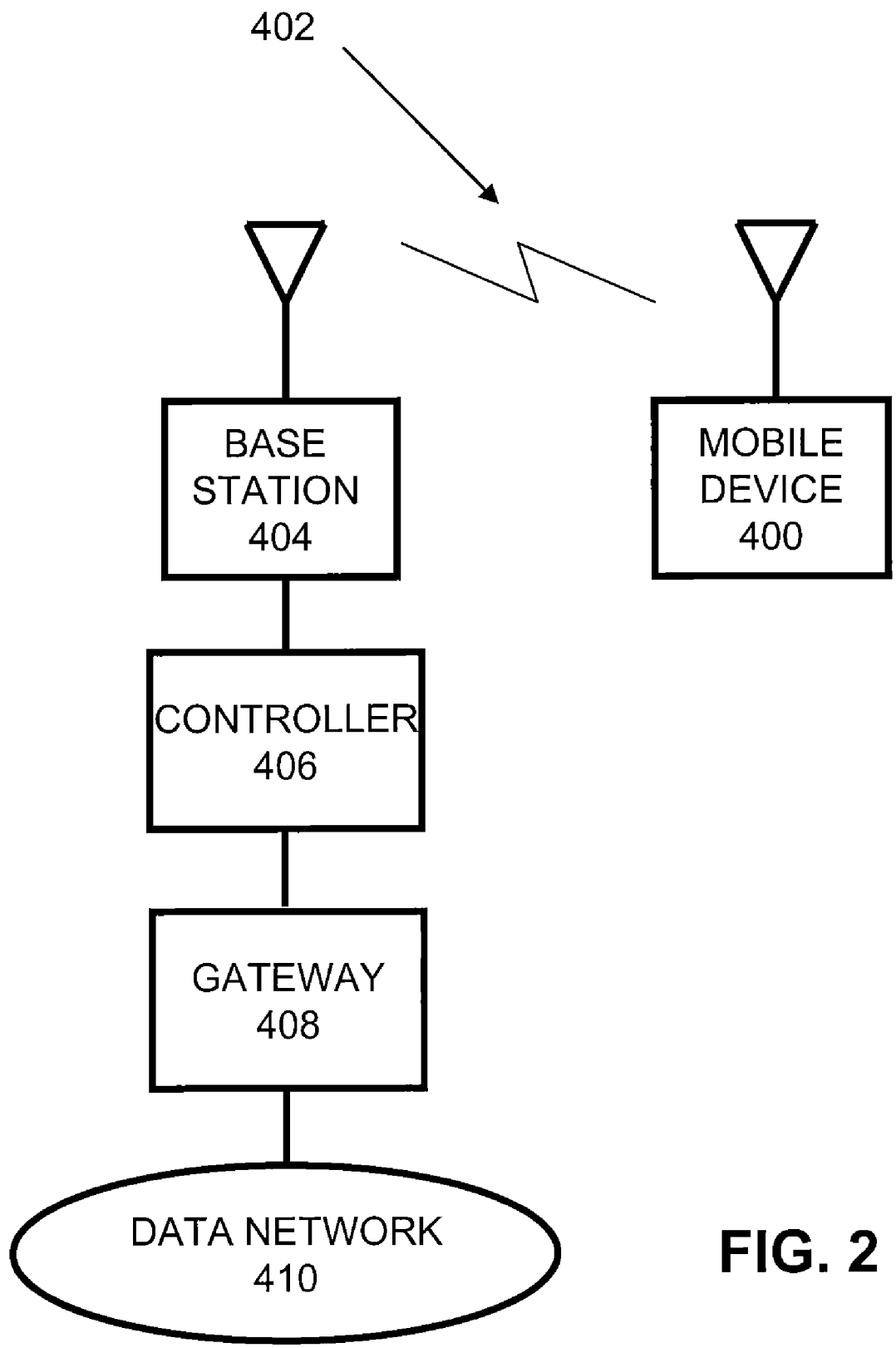
FIG. 2 illustrates an Evolved Universal Terrestrial Radio Access Network (E-UTRAN) in example embodiments of the present invention.

FIG. 2 shows a non-limiting example of a radio communications system in which example embodiments of the present invention can be implemented. The illustrated architecture uses Evolved Universal Terrestrial Radio Access (E-UTRA) and is thus known as an Evolved Universal Mobile Telecommunication System (UMTS) Terrestrial Radio Access Network (E-UTRAN). An Evolved Universal Terrestrial Radio Access Network (E-UTRAN) consists of E-UTRAN Node Bs (eNBs), which are configured to provide both base station and control functionalities of the radio access network. The eNBs may provide E-UTRA features such as user plane radio link control/medium access control/physical layer protocol (RLC/MAC/PHY) and control plane radio resource control (RRC) protocol terminations towards the mobile devices.

A communication device can be used for accessing various services and/or applications provided via a communication system as shown in FIG. 2. In wireless or mobile systems, the access is provided via an access interface between a mobile communication device 400 and an appropriate wireless access system 402. A mobile device 400 can typically access wirelessly a communication system via at least one base station 404 or similar wireless transmitter and/or receiver node. Embodiments of the invention described above with respect to FIG. 1 are included in the mobile device 400, to provide the apparatus and the method of IQ gain imbalance correction in the radio receiver for demodulating quadrature (IQ) modulated radio frequency signals and in the radio transmitter used in the mobile device 400. Embodiments of the invention described above with respect to FIG. 1 are included in the base station 404, to provide the apparatus and the method of IQ gain imbalance correction in the radio receiver for demodulating quadrature (IQ) modulated radio frequency signals and in the radio transmitter used in the base station 404. In this manner, the gain imbalance in the radio receivers and transmitters of the radio communications system 402 of FIG. 2 are corrected in an improved manner with a minimal amount of hardware.

Non-limiting examples of appropriate access nodes are a base station of a cellular system and a base station of a wireless local area network (WLAN). Each mobile device may have one or more radio channels open at the same time and may receive signals from more than one base station.

A base station is typically controlled by at least one appropriate controller entity 406 so as to enable operation thereof and management of mobile devices in communication with the base station. The controller entity is typically provided with memory capacity and at least one data processor. In FIG. 2 the base station node 404 is connected to a data network 410 via an appropriate gateway 408. A gateway function between the access system and another network such as a packet data network may be provided by means of any appropriate gateway node, for example a packet data gateway and/or an access gateway.

The data processing functions may be provided by means of one or more data processor entities. Data processing may be provided in the mobile station 400 or in the base station 404 of a radio communications system. Appropriately adapted computer program code product may be used for implementing the embodiments of the invention described above with respect to FIG. 1, when loaded to a computer or processor. The program code product for providing the operation may be stored on and provided by means of a carrier medium such as a carrier disc, card or tape. One example is to download the program code product via a data network. Implementation may be provided with appropriate software in a mobile user equipment or a base station of a radio communications system. Embodiments of the invention described above with respect to FIG. 1 are implemented by the computer program code product when its instructions are executed by the data processor in the mobile device 400 or by the data processor in the base station 404, to provide the method of IQ gain imbalance correction in the radio receiver for demodulating quadrature (IQ) modulated radio frequency signals and in the radio transmitter used in the mobile device 400 or in the base station 404, respectively. In this manner, the gain imbalance in the radio receivers and transmitters of the radio communications system 402 of FIG. 2 are corrected in an improved manner with a minimal amount of hardware.

While the example embodiments of the invention have been particularly shown and described, it will be understood to those skilled in the art that various changes in form and detail may be made to the example embodiments without departing from the spirit and scope of the embodiments of the invention as defined by the appendant claims.

The invention claimed is:

1. A radio receiver comprising:
an in-phase channel and a quadrature channel, said channels being provided in parallel at a respective input with quadrature modulated radio frequency signals; and an error correction loop for detecting and correcting an imbalance in gain between at least part of said in-phase channel and a corresponding part of said quadrature channel, wherein said error correction loop comprises:

a detector adapted to calculate $\text{Error\_det}_{new}=|I'|-|Q'|$, where I' and Q' are the in-phase and quadrature channels respectively;

a loop filter arranged to receive $\text{Error\_det}_{new}$ from the detector and calculate $\text{loop\_filter\_out}_{new} += K_i * \text{Error\_det}_{new}$, where $K_i$ is the loop filter constant and $\text{loop\_filter\_out}_{new}$ has an initial value of 1; and a multiplier arranged to receive $\text{loop\_filter\_out}_{new}$ from the loop filter and adjust the signal of the quadrature channel by multiplying the signal by $\text{loop\_filter\_out}_{new}$.

2. A radio receiver according to claim 1, wherein the error correction loop is provided in a digital domain.

3. A radio receiver according to claim 2, wherein the detector is adapted to evaluate an imbalance in gain of down-converted signals after being converted from analog into digital signals.

4. A radio receiver according to claim 3, wherein detector comprises a common digital signal processor for performing the evaluation.

5. A radio receiver according to claim 1, wherein the error correction loop is provided in an analogue domain.

6. A radio receiver according to claim 1, wherein the error correction loop is provided across analog-to-digital converters, whereby that the detector is provided in a digital domain and the multiplier is provided in an analogue domain.

7. A radio receiver according to claim 5, wherein the detector comprises a power or a Vrms (Voltage root mean square) detector for detecting the power of signals in both the in-phase and quadrature channels at some point after down-conversion.

8. A radio receiver according to claim 1, wherein the radio receiver is an integrated radio receiver.

9. A method, comprising:

feeding quadrature modulated radio frequency signals in parallel to an in-phase channel and to a quadrature channel of a radio receiver;

calculating $\text{Error\_det}_{new}=|I'|-|Q'|$, where I' and Q' are the in-phase and quadrature channels respectively; and calculating $\text{loop\_filter\_out}_{new} += K_i * \text{Error\_det}_{new}$, where $K_i$ is the loop filter constant and $\text{loop\_filter\_out}_{new}$ has an initial value of 1; and multiplying the signal of the quadrature channel by $\text{loop\_filter\_out}_{new}$;

whereby an imbalance in gain between an in-phase channel and a quadrature channel of a quadrature demodulating radio receiver is reduced.

10. A radio transmitter comprising:

an in-phase channel for in-phase components of a signal;

a quadrature channel for quadrature phase components of said signal; and an error correction loop for detecting and correcting an imbalance in gain between at least part of said in-phase channel and a corresponding part of said quadrature channel, wherein said error correction loop comprises:

a detector adapted to calculate $\text{Error\_det}_{new}=|I'|-|Q'|$, where I' and Q' are the in-phase and quadrature channels respectively;

a loop filter arranged to receive $\text{Error\_det}_{new}$ from the detector and calculate $\text{loop\_filter\_out}_{new} += K_i * \text{Error\_det}_{new}$, where $K_i$ is the loop filter constant and $\text{loop\_filter\_out}_{new}$ has an initial value of 1; and a multiplier arranged to receive $\text{loop\_filter\_out}_{new}$ from the loop filter and adjust the signal of the quadrature channel by multiplying the signal by $\text{loop\_filter\_out}_{new}$.

11. A method, comprising:

feeding an in-phase component of a signal to an in-phase channel and a quadrature-phase component of said signal to a quadrature channel of a radio transmitter;

calculating $\text{Error\_det}_{new}=|I'|-|Q'|$, where I' and Q' are the in-phase and quadrature channels respectively;

calculating $\text{loop\_filter\_out}_{new} += K_i * \text{Error\_det}_{new}$, where $K_i$ is the loop filter constant and $\text{loop\_filter\_out}_{new}$ has an initial value of 1; and multiplying the signal of the quadrature channel by $\text{loop\_filter\_out}_{new}$;

whereby an imbalance in gain between an in-phase channel and a quadrature channel of a quadrature modulating radio transmitter is reduced.

12. An apparatus, comprising:

a detector in an error correction unit, for calculating $\text{Error\_det}_{new}=|I'|-|Q'|$, where I' and Q' the in-phase and quadrature channels respectively;

a loop filter in the error correction unit, arranged to receive $\text{Error\_det}_{new}$ from the detector and calculate $\text{loop\_filter\_out}_{new} += K_i * \text{Error\_det}_{new}$, where $K_i$ is the loop filter constant and $\text{loop\_filter\_out}_{new}$ has an initial value of 1; and a multiplier in the error correction unit, arranged to receive $\text{loop\_filter\_out}_{new}$ from the loop filter and adjust the signal of the quadrature channel by multiplying said signal by $\text{loop\_filter\_out}_{new}$.

whereby said error correction unit detects and corrects an imbalance in gain between at least part of an in-phase channel and a corresponding part of a quadrature channel.

13. A method, comprising:

calculating $\text{Error\_det}_{new}=|I'|-|Q'|$, where I' and Q' are the in-phase and quadrature channels respectively;

calculating $\text{loop\_filter\_out}_{new} += K_i * \text{Error\_det}_{new}$, where $K_i$ is the loop filter constant and $\text{loop\_filter\_out}_{new}$ has an initial value of 1; and multiplying the signal of the quadrature channel by $\text{loop\_filter\_out}_{new}$;

whereby detecting and correcting an imbalance in gain between at least part of an in-phase channel and a corresponding part of a quadrature channel, is achieved.

14. A network entity, comprising:

a radio receiver;

an in-phase channel and a quadrature channel in said radio receiver, said channels being provided in parallel at a respective input with quadrature modulated radio frequency signals; and an error correction loop in said radio receiver, for detecting and correcting an imbalance in gain between at least part of said in-phase channel and a corresponding part of said quadrature channel, wherein said error correction loop in said radio receiver, comprises:

a detector in said radio receiver, adapted to calculate $\text{Error\_det}_{new}=|I'|-|Q'|$, where I' and Q' are the in-phase and quadrature channels respectively;

a loop filter in said radio receiver, arranged to receive $\text{Error\_det}_{new}$ from the detector and calculate $\text{loop\_filter\_out}_{new} += K_i * \text{Error\_det}_{new}$, where $K_i$ is the loop filter constant and $\text{loop\_filter\_out}_{new}$ has an initial value of 1; and a multiplier in said radio receiver, arranged to receive loop_filter_out$_{new}$ from the loop filter and adjust the signal of the quadrature channel by multiplying the signal by loop_filter_out$_{new}$;

the network entity further comprising:

a radio transmitter;

an in-phase channel in said radio transmitter, for in-phase components of a signal;

a quadrature channel in said radio transmitter, for quadrature phase components of said signal; and an error correction loop in said radio transmitter, for detecting and correcting an imbalance in gain between at least part of said in-phase channel and a corresponding part of said quadrature channel, wherein said error correction loop in said radio transmitter, comprises:

a detector in said radio transmitter, adapted to calculate Error_det$_{new}$=|I'|−|Q'|, where I' and Q' are the in-phase and quadrature channels respectively;

a loop filter in said radio transmitter, arranged to receive Error_det$_{new}$ from the detector and calculate loop_filter_out$_{new}$+=K$_i$ * Error_det$_{new}$, where K$_i$ is the loop filter constant and loop_filter_out$_{new}$ has an initial value of 1; and a multiplier in said radio transmitter, arranged to receive loop_filter_out$_{new}$ from the loop filter and adjust the signal of the quadrature channel by multiplying the signal by loop_filter_out$_{new}$.

15. A network entity according to claim 14, wherein the network entity is a base station.

16. A mobile station, comprising:

a radio receiver;

an in-phase channel and a quadrature channel in said radio receiver, said channels being provided in parallel at a respective input with quadrature modulated radio frequency signals; and an error correction loop in said radio receiver, for detecting and correcting an imbalance in gain between at least part of said in-phase channel and a corresponding part of said quadrature channel, wherein said error correction loop in said radio receiver, comprises:

a detector in said radio receiver, adapted to calculate Error_det$_{new}$=|I'|−|Q'|, where I' and Q' are the in-phase and quadrature channels respectively;

a loop filter in said radio receiver, arranged to receive Error_det$_{new}$ from the detector and calculate loop_filter_out$_{new}$+=K$_i$ * Error_det$_{new}$, where K$_i$ is the loop filter constant and loop_filter_out$_{new}$ has an initial value of 1; and a multiplier in said radio receiver, arranged to receive loop_filter_out$_{new}$ from the loop filter and adjust the signal of the quadrature channel by multiplying the signal by loop_filter_out$_{new}$;

the mobile station further comprising:

a radio transmitter;

an in-phase channel in said radio transmitter, for in-phase components of a signal;

a quadrature channel in said radio transmitter, for quadrature phase components of said signal; and an error correction loop in said radio transmitter, for detecting and correcting an imbalance in gain between at least part of said in-phase channel and a corresponding part of said quadrature channel, wherein said error correction loop in said radio transmitter, comprises:

a detector in said radio transmitter, adapted to calculate Error_det$_{new}$=|I'|−|Q'|, where I' and Q' are the in-phase and quadrature channels respectively;

a loop filter in said radio transmitter, arranged to receive Error_det$_{new}$ from the detector and calculate loop_filter_out$_{new}$+=K$_i$ * Error_det$_{new}$, where K$_i$ is the loop filter constant and loop_filter_out$_{new}$ has an initial value of 1; and a multiplier in said radio transmitter, arranged to receive loop_filter_out$_{new}$ from the loop filter and adjust the signal of the quadrature channel by multiplying the signal by loop_filter_out$_{new}$.

17. A radio communications system, comprising:

a mobile station and a base station, each of which comprises:

a radio receiver;

an in-phase channel and a quadrature channel in said radio receiver, said channels being provided in parallel at a respective input with quadrature modulated radio frequency signals; and an error correction loop in said radio receiver, for detecting and correcting an imbalance in gain between at least part of said in-phase channel and a corresponding part of said quadrature channel, wherein said error correction loop in said radio receiver, comprises:

a detector in said radio receiver, adapted to calculate Error_det$_{new}$=|I'|−|Q'|, where I' and Q' are the in-phase and quadrature channels respectively;

a loop filter in said radio receiver, arranged to receive Error_det$_{new}$ from the detector and calculate loop_filter_out$_{new}$+=K$_i$ * Error_det$_{new}$, where K$_i$ is the loop filter constant and loop_filter_out$_{new}$ has an initial value of 1; and a multiplier in said radio receiver, arranged to receive loop_filter_out$_{new}$ from the loop filter and adjust the signal of the quadrature channel by multiplying the signal by loop_filter_out$_{new}$;

the mobile station and the base station, each further comprising:

a radio transmitter;

an in-phase channel in said radio transmitter, for in-phase components of a signal;

a quadrature channel in said radio transmitter, for quadrature phase components of said signal; and an error correction loop in said radio transmitter, for detecting and correcting an imbalance in gain between at least part of said in-phase channel and a corresponding part of said quadrature channel, wherein said error correction loop in said radio transmitter, comprises:

a detector in said radio transmitter, adapted to calculate Error_det$_{new}$=|I'|−|Q'|, where I' and Q' are the in-phase and quadrature channels respectively;

a loop filter in said radio transmitter, arranged to receive Error_det$_{new}$ from the detector and calculate loop_filter_out$_{new}$+=K$_i$ * Error_det$_{new}$, where K$_i$ is the loop filter constant and loop_filter_out$_{new}$ has an initial value of 1; and a multiplier in said radio transmitter, arranged to receive loop_filter_out$_{new}$ from the loop filter and adjust the signal of the quadrature channel by multiplying the signal by loop_filter_out$_{new}$.

18. A non-transitory computer program product comprising: a non-transitory computer readable medium containing program code executable on a data processor;
- program code in said computer readable medium for feeding quadrature modulated radio frequency signals in parallel to an in-phase channel and to a quadrature channel of a radio receiver;
- program code in said computer readable medium for calculating $Error\_det_{new}=|I'|-|Q'|$, where I' and Q' are the in-phase and quadrature channels respectively; and
- program code in said computer readable medium for calculating $loop\_filter\_out_{new} += K_i * Error\_det_{new}$, where $K_i$ is the loop filter constant and $loop\_filter\_out_{new}$ has an initial value of 1; and multiplying the signal of the quadrature channel by $loop\_filter\_out_{new}$;
- whereby an imbalance in gain between an in-phase channel and a quadrature channel of a quadrature demodulating radio receiver is reduced.

19. A non-transitory computer program product comprising: a non-transitory computer readable medium containing program code executable on a data processor;
- program code in said computer readable medium for feeding an in-phase component of a signal to an in-phase channel and a quadrature-phase component of said signal to a quadrature channel of a radio transmitter;
- program code in said computer readable medium for calculating $Error\_det_{new}=|I'|-|Q'|$, where I' and Q' are the in-phase and quadrature channels respectively;
- program code in said computer readable medium for calculating $loop\_filter\_out_{new} += K_i * Error\_det_{new}$, where $K_i$ is the loop filter constant and $loop\_filter\_out_{new}$ has an initial value of 1; and
- program code in said computer readable medium for multiplying the signal of the quadrature channel by $loop\_filter\_out_{new}$;
- whereby an imbalance in gain between an in-phase channel and a quadrature channel of a quadrature modulating radio transmitter is reduced.

20. An apparatus, comprising:
- means for feeding quadrature modulated radio frequency signals in parallel to an in-phase channel and to a quadrature channel of a radio receiver;
- means for calculating $Error\_det_{new}=|I'|-|Q'|$, where I' and Q' are the in-phase and quadrature channels respectively; and
- means for calculating $loop\_filter\_out_{new} += K_i * Error\_det_{new}$, where $K_i$ is the loop filter constant and $loop\_filter\_out_{new}$ has an initial value of 1; and multiplying the signal of the quadrature channel by $loop\_filter\_out_{new}$;
- whereby an imbalance in gain between an in-phase channel and a quadrature channel of a quadrature demodulating radio receiver is reduced.

21. An apparatus, comprising:
- means for feeding an in-phase component of a signal to an in-phase channel and a quadrature-phase component of said signal to a quadrature channel of a radio transmitter;
- means for calculating $Error\_det_{new}=|I'|-|Q'|$, where I' and Q' are the in-phase and quadrature channels respectively;
- means for calculating $loop\_filter\_out_{new} += K_i * Error\_det_{new}$, where $K_i$ is the loop filter constant and $loop\_filter\_out_{new}$ has an initial value of 1; and
- means for multiplying the signal of the quadrature channel by $loop\_filter\_out_{new}$;
- whereby an imbalance in gain between an in-phase channel and a quadrature channel of a quadrature modulating radio transmitter is reduced.

\* \* \* \* \*